(12) United States Patent
Hashimoto et al.

(10) Patent No.: US 10,161,059 B2
(45) Date of Patent: Dec. 25, 2018

(54) GROUP III NITRIDE BULK CRYSTALS AND THEIR FABRICATION METHOD

(71) Applicants: SIXPOINT MATERIALS, INC., Buellton, CA (US); SEOUL SEMICONDUCTOR CO., LTD., Ansan-si, Gyeonggi-do (KR)

(72) Inventors: Tadao Hashimoto, Santa Barbara, CA (US); Edward Letts, Buellton, CA (US)

(73) Assignees: SixPoint Materials, Inc., Buellton, CA (US); Seoul Semiconductor Co., Ltd., Ansan-si (KR)

( * ) Notice: Subject to any disclaimer, the term of this patent is extended or adjusted under 35 U.S.C. 154(b) by 334 days.

(21) Appl. No.: 14/720,815

(22) Filed: May 24, 2015

(65) Prior Publication Data
US 2015/0337453 A1    Nov. 26, 2015

Related U.S. Application Data

(60) Provisional application No. 62/002,488, filed on May 23, 2014.

(51) Int. Cl.
*C30B 25/02* (2006.01)
*C30B 23/02* (2006.01)
(Continued)

(52) U.S. Cl.
CPC ............ *C30B 23/025* (2013.01); *C30B 7/105* (2013.01); *C30B 9/10* (2013.01); *C30B 23/066* (2013.01);
(Continued)

(58) Field of Classification Search
None
See application file for complete search history.

(56) References Cited

U.S. PATENT DOCUMENTS

| 5,868,837 A | 2/1999 | DiSalvo et al. |
| 6,273,948 B1 | 8/2001 | Porowski et al. |

(Continued)

FOREIGN PATENT DOCUMENTS

| EP | 2100990 A1 | 9/2009 |
| WO | WO2007008198 A1 | 1/2007 |

(Continued)

OTHER PUBLICATIONS

PCT/US2015/032330 International Search Report and Written Opinion dated Jul. 29, 2015, pp. 12.

(Continued)

*Primary Examiner* — Guinever S Gregorio
(74) *Attorney, Agent, or Firm* — Strategic Innovation IP Law Offices, P.C.

(57) ABSTRACT

In one instance, the invention provides a bulk crystal of group III nitride having a thickness of more than 1 mm without cracking above the sides of a seed crystal. This bulk group III nitride crystal is expressed as $Ga_{x1}Al_{y1}In_{1-x1-y1}N$ ($0 \leq x1 \leq 1$, $0 \leq x1+y1 \leq 1$) and the seed crystal is expressed as $Ga_{x2}Al_{y2}In_{1-x2-y2}N$ ($0 \leq x2 \leq 1$, $0 \leq x2+y2 \leq 1$). The bulk crystal of group III nitride can be grown in supercritical ammonia or a melt of group III metal using at least one seed crystal having basal planes of c-orientation and sidewalls of m-orientation. By exposing only c-planes and m-planes in this instance, cracks originating from the sides of the seed crystal are avoided.

11 Claims, 2 Drawing Sheets

(51) Int. Cl.

| | |
|---|---|
| *C30B 7/10* | (2006.01) |
| *H01L 29/20* | (2006.01) |
| *H01L 29/32* | (2006.01) |
| *C30B 23/06* | (2006.01) |
| *C30B 25/20* | (2006.01) |
| *C30B 29/66* | (2006.01) |
| *C30B 29/64* | (2006.01) |
| *C30B 9/10* | (2006.01) |
| *C30B 29/40* | (2006.01) |

(52) U.S. Cl.
CPC ............ *C30B 25/20* (2013.01); *C30B 29/403* (2013.01); *C30B 29/64* (2013.01); *C30B 29/66* (2013.01); *H01L 29/2003* (2013.01); *H01L 29/32* (2013.01)

(56) References Cited

U.S. PATENT DOCUMENTS

| | | | |
|---|---|---|---|
| 6,656,615 | B2 | 12/2003 | Dwiliński et al. |
| 7,078,731 | B2 | 7/2006 | D'Evelyn et al. |
| 7,132,730 | B2 | 11/2006 | Dwiliński et al. |
| 7,160,388 | B2 | 1/2007 | Dwiliński et al. |
| 8,253,221 | B2 | 8/2012 | Hashimoto et al. |
| 9,243,344 | B2 | 1/2016 | Hashimoto et al. |
| 9,790,617 | B2 | 10/2017 | Hashimoto et al. |
| 2005/0093003 | A1 | 5/2005 | Shibata |
| 2007/0234946 | A1 | 10/2007 | Hashimoto et al. |
| 2008/0081015 | A1 | 4/2008 | Sarayama et al. |
| 2009/0072352 | A1 | 3/2009 | Hashimoto et al. |
| 2009/0309105 | A1* | 12/2009 | Letts ............... C30B 7/10 257/76 |
| 2010/0075107 | A1 | 3/2010 | Saito et al. |
| 2010/0104495 | A1* | 4/2010 | Kawabata ............ C30B 7/10 423/409 |
| 2010/0233870 | A1 | 9/2010 | Oshima |
| 2013/0015492 | A1 | 1/2013 | Hashimoto et al. |
| 2013/0065036 | A1 | 3/2013 | Hayashi et al. |
| 2014/0065796 | A1* | 3/2014 | Hashimoto ........... C30B 29/406 438/460 |
| 2015/0337457 | A1 | 11/2015 | Hashimoto et al. |
| 2015/0340444 | A1 | 11/2015 | Hashimoto et al. |

FOREIGN PATENT DOCUMENTS

| | | |
|---|---|---|
| WO | WO2007117689 A2 | 10/2007 |
| WO | WO2010017232 A1 | 2/2010 |
| WO | WO2015179852 A1 | 11/2015 |

OTHER PUBLICATIONS

U.S. Appl. No. 14/720,819 Office Action dated Mar. 14, 2017.
EP 15727806.0 Communication dated Jan. 26, 2017.
U.S. Appl. No. 14/720,816 Office Action dated May 10, 2017.
U.S. Appl. No. 14/720,819 Amendment dated Jun. 13, 2017.
EP 15727806.0 Response and amendment dated Aug. 1, 2017.
U.S. Appl. No. 14/720,816 Amendment dated Aug. 10, 2017.
U.S. Appl. No. 14/720,819 Notice of Allowability dated Aug. 11, 2017.
U.S. Appl. No. 14/720,816 Official Action dated Aug. 30, 2017.
U.S. Appl. No. 14/720,816 Amendment dated Nov. 30, 2017.
U.S. Appl. No. 14/720,816 Office Action dated Dec. 15, 2017.
Richter, et al., "Hydride Vapor Phase Epitaxy of GaN Boules Using High Growth Rates", Elsevier, Journal of Crystal Growth 312, Apr. 10, 2010, pp. 2537-2541, doi: 10.1016/j.jcrysgro.2010.04.009.
Khattak, et al., "Growth of 15-inch Diameter Sapphire Boules", Research Gate, LIGO-P030027-00-D, Proceedings of SPIE, vol. 5078, Sep. 2003, pp. 1-8.
Scheel, Hans J., "The Development of Crystal Growth Technology", 2003, ISBN: 0-471-49059-8, pp. 1-12.
Rubicon Technology Grows 200kg "Super Boule", LED Inside, Apr. 21, 2009, pp. 1-3.
ClearlySapphire.com, "Growth", 2018, pp. 1-3.
Antonov, et al., "New Advances and Developments in the Stepanov Method for the Growth of Shaped Crystals", Melt Growth, Crystallography Reports, vol. 47, Suppl. 1, Oct. 1, 2002, pp. S43-S52.
S&D Materials, LLC, "Crystal Growth Technologies", 2008, pp. 1-10, http://www.sdmaterials.com/crystal_growth_technologies_html.
Rudolph, et al., "LEC Growth of Semi-Insulating GaAs Crystals in Traveling Magnetic Field Generated in a Heater-Magnet Module", Elsevier, Journal of Crystal Growth 311, Aug. 29, 2009, pp. 4543-4548, doi: 10.1016/j.jcrysgro.2009.08.024.
Patzold, et al., "Vertical Gradient Freeze Growth of Single-Crystalline Semiconductors with Non-Steady Magnetic Fields", Research Gate, Feb. 11, 2014, pp. 1-23.
AXT Inc., VGF Technology, Feb. 21, 2018, pp. 1, http://www.axt.com.
Fujito, et al., "Bulk GaN Crystals Grown by HVPE", Elsevier, Journal of Crystal Growth 311, Jan. 19, 2009, pp. 3011-3014, doi: 10.1016/j.jcrysgro.2009.01.046.
Motoki, et al., "Growth and Characterization of Freestanding GaN Substrates", Elsevier, Journal of Crystal Growth 237-239, 2002, pp. 912-921.
U.S. Appl. No. 14/720,816 Amendment dated Mar. 26, 2018.
US Appl. No. 14/720,816 Office Action dated May 4, 2018.

* cited by examiner

GROUP III NITRIDE BULK CRYSTALS AND THEIR FABRICATION METHOD

CROSS REFERENCE TO RELATED APPLICATIONS

This application claims priority to U.S. App. No. 62/002,488 filed May 23, 2014 and entitled "Group III Nitride Bulk Crystals and Their Fabrication Method," inventors Tadao Hashimoto and Edward Letts, the entire content of which is incorporated by reference herein for all purposes.

This application is also related to the PCT application filed on same date as this application and entitled "Group III Nitride Bulk Crystals and Their Fabrication Method," inventors Tadao Hashimoto and Edward Letts, the entire content of which is incorporated by reference herein for all purposes.

This application is also related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPER-CRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility patent application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,";

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

U.S. Utility patent application Ser. No. 61/106,110, filed on Oct. 16, 2008, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility patent application Ser. No. 61/694,119, filed on Aug. 28, 2012, by Tadao Hashimoto, Edward Letts, Sierra Hoff, entitled "GROUP III NITRIDE WAFER AND PRODUCTION METHOD,";

U.S. Utility Patent Application Ser. No. 61/705,540, filed on Sep. 25, 2012, by Tadao Hashimoto, Edward Letts, Sierra Hoff, entitled "METHOD OF GROWING GROUP III NITRIDE CRYSTALS,";

which applications are incorporated by reference herein in their entirety as if put forth in full below.

BACKGROUND

Field of the Invention

The invention relates to a bulk crystal of semiconductor material used to produce semiconductor wafers for various devices including optoelectronic devices such as light emitting diodes (LEDs) and laser diodes (LDs), and electronic devices such as transistors. More specifically, the invention provides a bulk crystal of group III nitride such as gallium nitride. The invention also provides various methods of making these crystals.

Description of the Existing Technology

This document refers to several publications and patents as indicated with numbers within brackets, e.g., [x]. Following is a list of these publications and patents:

[1] R. Dwiliński, R. Doradziński, J. Garczyński, L. Sierzputowski, Y. Kanbara, U.S. Pat. No. 6,656,615.

[2] R. Dwiliński, R. Doradziński, J. Garczyński, L. Sierzputowski, Y. Kanbara, U.S. Pat. No. 7,132,730.

[3] R. Dwiliński, R. Doradziński, J. Garczyński, L. Sierzputowski, Y. Kanbara, U.S. Pat. No. 7,160,388.

[4] K. Fujito, T. Hashimoto, S. Nakamura, International Patent Application No. PCT/US2005/024239, WO07008198.

[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.

[6] D'Evelyn, U.S. Pat. No. 7,078,731.

Each of the references listed in this document is incorporated by reference in its entirety as if put forth in full herein, and particularly with respect to their description of methods of making and using group III nitride substrates.

Gallium nitride (GaN) and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide because GaN substrates are extremely expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve fundamental problems caused by heteroepitaxy, it is indispensable to utilize crystalline group III nitride wafers sliced from bulk group III nitride crystal ingots. For the majority of devices, crystalline GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Currently, the majority of commercially available GaN substrates are produced by a method called hydride vapor phase epitaxy (HVPE). HVPE is one of vapor phase methods, which has difficulty in reducing dislocation density less than $10^5$ cm$^{-2}$.

To obtain high-quality GaN substrates for which dislocation density is less than $10^5$ cm$^{-2}$, various growth methods such as ammonothermal growth, flux growth, high-temperature solution growth have been developed. Ammonothermal method grows group III nitride crystals in supercritical ammonia [1-6]. The flux method and the high-temperature solution growth use a melt of group III metal.

Recently, high-quality GaN substrates having dislocation density less than $10^5$ cm$^{-2}$ can be obtained by ammonothermal growth. Since the ammonothermal method can produce a true bulk crystal, one can grow one or more thick crystals and slice them to produce GaN wafers. We have been developing bulk crystals of GaN by the ammonothermal method. However, we found it quite challenging to avoid cracking of bulk crystals, especially when the total thickness of the bulk crystal exceeds 1 mm. We believe that the cracking problem in bulk group III nitride is a universal problem for any bulk growth methods including the ammonothermal method. Thus, this invention is intended to obtain crack-free bulk group III nitride crystals using any bulk growth method, such as growth in supercritical ammonia or from a melt of group III metals.

SUMMARY OF THE INVENTION

In one instance, the invention provides a bulk crystal of group III nitride having a thickness of more than 1 mm without cracking above the sides of a seed crystal. This bulk group III nitride crystal is expressed as $Ga_{x1}Al_{y1}In_{1-x1-y1}N$ ($0 \leq x1 \leq 1$, $0 \leq x1+y1 \leq 1$) and the seed crystal is expressed as $Ga_{x2}Al_{y2}In_{1-x2-y2}N$ ($0 \leq x2 \leq 1$, $0 \leq x2+y2 \leq 1$). The bulk crystal of group III nitride can be grown in supercritical ammonia or a melt of group III metal using at least one seed crystal having basal planes of one orientation and all sidewalls of one or more other orientations that are slow-growing compared to the basal plane. For instance, the group III nitride seed crystal may have c-orientation basal planes and all sidewalls may be prismatic crystal faces with m-plane orientation. By exposing only c-planes and m-planes, cracks originating from the sides of the seed crystal are avoided.

The invention also provides a new seed crystal that can be used to grow bulk group III nitride. The seed crystal is expressed as $Ga_{x2}Al_{y2}In_{1-x2-y2}N$ ($0 \leq x2 \leq 1$, $0 \leq x2+y2 \leq 1$) and has one or more of the following traits in any combination: (A) the seed crystal may have (1) exposed basal planes on which most growth occurs and (2) exposed sidewalls that grow slowly compared to the basal planes; (B) each of the sidewalls of a seed crystal may grow at a rate that is less than 20 μm per day, while optionally a face essentially parallel to a basal plane may grow at a rate that is greater than 20 μm per day; (C) all sidewalls may grow at a rate that is less than 20% of the rate at which a face grows; (D) the basal planes of the seed crystal may be c-planes, and the sidewalls of the seed crystal may all be m-plane; (E) the seed crystal may be formed by hydride vapor-phase epitaxy (HVPE), molecular beam epitaxy (MBE), metal organic vapor-phase epitaxy (MOVPE), ammonothermal growth, or other method; (F) the seed crystal may have a hexagonal shape, a triangular shape, or a shape of a rhombus having no right angles.

In addition, the invention provides new methods of making a seed crystal as well as new methods of making a bulk crystal of group III nitride as well as wafers, optical devices, and semiconductor devices. The following methods may be used alone or in any combination. A seed crystal as described above can be made by growing group III nitride having the formula $Ga_{x2}Al_{y2}In_{1-x2-y2}N$ ($0 \leq x2 \leq 1$, $0 \leq x2+y2 \leq 1$) by vapor-phase epitaxy (HVPE), molecular beam epitaxy (MBE), metal organic vapor-phase epitaxy (MOVPE), or ammonothermal growth, for example, and removing a portion of the group III nitride to form a seed that has a first face, a second face, and a plurality of side-walls extending between the faces at the faces' periphery, with all of the sidewalls being slow-growing as compared to growth on the first face. The sidewalls may each have a length that is within +/−10% of the average length of the sidewalls. A seed crystal may be made by forming a raw seed crystal from group III nitride using HVPE, MBE, or MOVPE, and shaping this raw seed crystal to have slow-growing sidewalls and a faster-growing face. The method may further comprise placing two essentially identical group III nitride crystals together such that Ga-polar faces touch one another to form a new seed prior to making a bulk crystal. The method of making a bulk crystal may comprise making a seed crystal from group III nitride formed using HVPE, MBE, or MOVPE, shaping this group III nitride to have slow-growing sidewalls and a faster-growing face, and using the seed crystal in a bulk growth process such as ammonothermal growth or flux growth to form the bulk crystal.

The invention also provides a new ingot or bulk crystal of group III nitride. The bulk crystal is expressed as $Ga_{x1}Al_{y1}In_{1-x1-y1}N$ ($0 \leq x1 \leq 1$, $0 \leq x1+y1 \leq 1$). The bulk crystal has one or more of the following traits in any combination: (a) the bulk crystal has a thickness greater than 1 mm without any cracks in the crystal above the seed's sidewall edge (in the area bridging the sidewall and new growth on the sidewall of the seed); (b) the bulk crystal has a thickness greater than 1 mm and has fewer cracks in the crystal above the original seed's edge than a comparative bulk crystal grown under otherwise identical conditions but grown using a square seed having the same surface area as the original seed but having m-plane and a-plane walls.

Further, the invention provides new wafers of group III nitride and semiconductor and optical devices on those wafers as well as methods of making these.

BRIEF DESCRIPTION OF THE DRAWINGS

Referring now to the drawings in which like reference numbers represent corresponding parts throughout.

In the figure each number represents the followings:
11. A location of a seed crystal,
11A. A side of a-plane on the seed crystal,
11B. A side of m-plane on the seed crystal,
12. A bulk crystal of group III nitride,
13A. Small cracks above the seed crystal edge
13B. A large crack originating from the small crack above the seed crystal edge.

Figure 2:
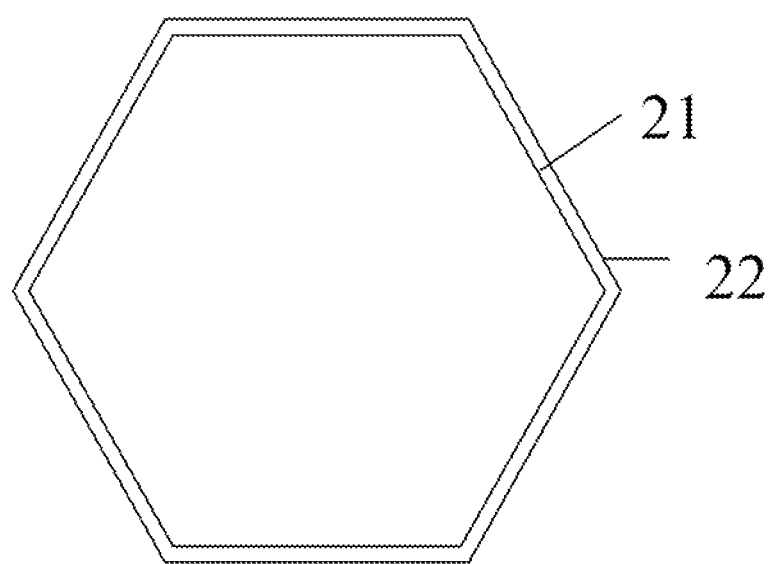

FIG. 2 is a schematic drawing of the top view of a bulk crystal of group III nitride in this invention.

In the figure each number represents the followings:
21. A location of a seed crystal,
22. A bulk crystal of group III nitride.

DETAILED DESCRIPTION OF THE INVENTION

Overview

The bulk crystal of the present invention is typically sliced to produce group III nitride wafers suitable for fabricating various optoelectronic and electronic devices such as LEDs, LD, transistors, and photodetectors by known techniques. Many optoelectronic and electronic devices are fabricated with thin films of group III nitride alloys (i.e. alloys of GaN, AlN and InN). The group III nitride alloys are typically expressed as $Ga_xAl_yIn_{1-x-y}N$ ($0 \leq x \leq 1$, $0 \leq x+y \leq 1$). Since the group III metallic elements (i.e. Al, Ga, In) shows similar chemical characteristics, nitrides of these group III elements makes alloys or solid solution. In addition, crystal growth nature of these group III nitrides are quite similar.

Due to limited availability and high cost of single crystalline substrates of group III nitride, these devices have been fabricated on so-called heteroepitaxial substrates such as sapphire and silicon carbide. Since the heteroepitaxial substrates are chemically and physically different from the group III nitride, the device typically has a high density of dislocations ($10^{18}$~$10^{10}$ cm$^{-2}$) generated at the interface between the heteroepitaxial substrate and the device layer. Such dislocations deteriorate performance and reliability of devices, thus substrates composed of crystalline group III nitride such as GaN and AlN are favorable.

Currently, the majority of commercially available GaN substrates is produced with HVPE, in which it is difficult to reduce the dislocation density to less than $10^5$ cm$^{-2}$. Although the dislocation density of HVPE-GaN substrates is a few orders of magnitude lower than GaN film on heteroepitaxial substrates, the dislocation density is still a few orders of magnitude higher than typical silicon devices in electronics. To achieve higher device performance, lower dislocation density is required.

To attain dislocation density less than $10^5$ cm$^{-2}$, ammonothermal growth, which utilizes supercritical ammonia, has been developed. The ammonothermal method can produce GaN substrates with dislocation density less than $10^5$ cm$^{-2}$. One advantage of the ammonothermal method is that bulk crystals having a thickness larger than 1 mm can be grown. The ammonothermal method can also be used to grow crystals having various dopants such as donors (i.e. electron), acceptors (i.e. hole) or magnetic dopants. However, it is challenging to obtain a bulk crystal over 1 mm thick without cracking. Although the origin and mechanism for crack formation are not well known, a possible cause would be stress accumulation inside the crystal due to a slight mismatch of thermal expansion coefficient or other physical properties between the seed crystal and grown crystal. To produce group III nitride substrates without cracks, it is necessary to obtain crack-free bulk crystal of group III nitride.

Technical Description of the Invention

In an effort to reduce or eliminate cracking inside the bulk crystal of group III nitride having thickness larger than 1 mm, the current invention provides a method of making a bulk crystal of group III nitride in which a single-crystal seed has (1) exposed basal planes on which most growth occurs and (2) exposed sidewalls that grow slowly compared to the basal planes. The exposed surfaces may optionally have a small miscut angle (e.g. within approximately +/−5 degrees) from the crystallographic planes, but the miscut is not sufficiently large to cause rapid growth on the sidewalls. The single-crystal seed may be grown by hydride vapor-phase epitaxy (HVPE), molecular beam epitaxy (MBE), metal organic vapor-phase epitaxy (MOVPE), ammonothermal growth, or other method.

The sidewalls of this seed crystal grow more slowly than the face or basal plane grows when forming a bulk crystal of group III nitride using the seed. All sidewalls may grow at a rate that is less than 20% of the rate at which a face grows. All sidewalls instead or additionally may grow at a rate that is less than 20 µm per day in another instance, while optionally a face essentially parallel to a basal plane may grow at a rate that is greater than 20 µm per day.

For instance, the seed crystal may have c-planes (i.e. {0001} planes) as basal planes and only m-planes (i.e. {10-10} planes) as sidewalls. The exposed surface optionally has a small miscut angle (within approximately +/−5 degrees) from the crystallographic planes. The m-plane sidewalls may grow at a rate that is less than 20% of the rate at which a c-plane face grows. Instead or additionally, the m-plane sidewalls may grow at a rate that is less than 20 µm per day, while optionally a face essentially parallel to a basal c-plane may grow at a rate that is greater than 20 µm per day.

In the conventional ammonothermal growth of bulk group III nitride, free-standing GaN wafers fabricated by HVPE are commonly used as a seed crystal. The free-standing GaN wafers are typically supplied in a round shape or a square shape. When a whole piece is used as a seed, the seed shape is either a round shape or a square shape. If smaller pieces are cut from the whole piece, the shape is commonly square or rectangular. This type of seed crystal has c-planes, m-planes, and a-planes (i.e. {11-20} planes) or other semipolar planes (e.g. {11-21} planes).

Figure 1:
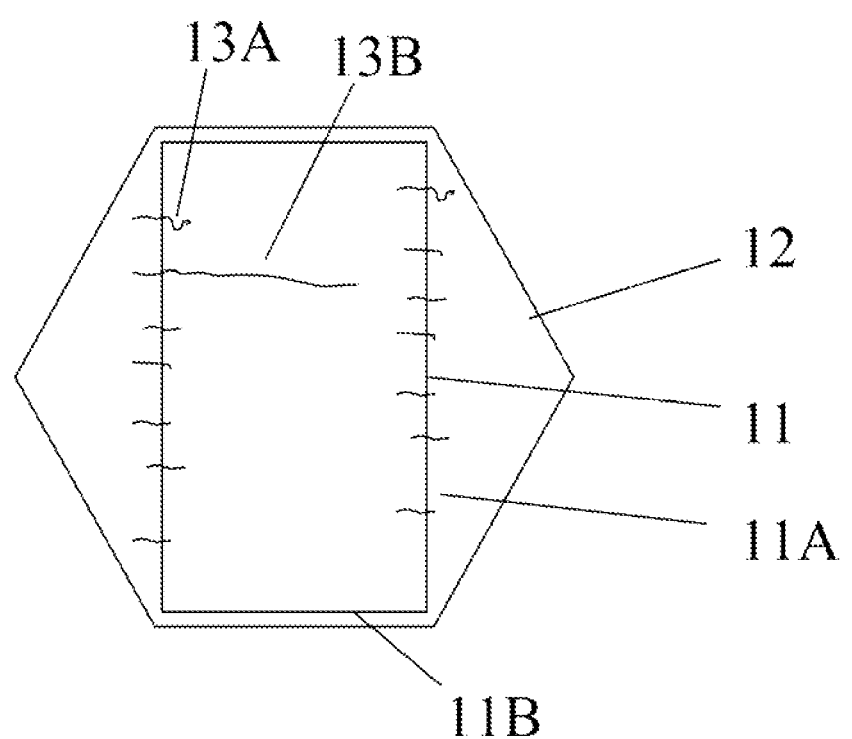
FIG. 1 is a schematic drawing of the top view of a bulk crystal of group III nitride in a conventional method.

Through our experiments, we found cracks tend to originate from the boundary of the seed crystal and the grown crystal. In other words, cracks occur above the edges of a certain orientation of the seed crystal and edges of m-plane sidewalls create fewer or no cracks than other orientations. FIG. 1 shows an example of such situation. When a rectangular piece of free-standing GaN having c-plane basal planes is used as a seed (11 in FIG. 1), the seed typically has exposed m-plane (11B in FIG. 1) and a-plane (11A in FIG. 1) sidewalls. During bulk crystal growth by the ammonothermal method, the crystal becomes hexagonally shaped due to the difference in growth speed on a-planes and m-planes, eventually exposing only m-plane sidewalls (12 in FIG. 1). We discovered that the majority of or all cracks occurs over the boundary of a-planes (13A in FIG. 1), and the regions over the m-plane boundary were less likely to have cracks. In addition, some of the small cracks extend over a much greater length within the crystal (13B in FIG. 1).

Based on this discovery, the current invention utilizes a seed crystal which exposes only slow-growing sidewalls such as m-plane sidewalls in addition to fast growing basal planes such as c-oriented basal planes as shown in FIG. 2. With this configuration, the grown crystal (22 in FIG. 2) does not expand much toward the lateral direction from the seed crystal (21 in FIG. 1), and crack generation is greatly reduced.

This could be due to the fact that the cracks propagate along m-planes. Another possible cause is that suppressing lateral growth reduces stress accumulation in the grown crystal. If the cross section of the grown crystal is observed, the crystal consists of growth domains, a domain over one side of the seed's basal plane, a domain over the other side of the seed's basal plane and domains over the sidewalls. These domains have interfaces together and the interface would experience a stress due to different growth speed, impurity incorporation, growth direction and/or other chemical and physical characteristics.

To minimize dissimilarity of the domains, the current invention minimizes the number of different crystallographic planes exposed for crystal growth. The seed crystal in one instance has only c-planes and m-planes exposed, with c-planes forming the basal planes and m-planes forming the sidewalls. Preferably, two seeds are attached together on Ga-polar c-planes to expose only N-polar c-planes and m-planes. This way, it is possible to reduce/eliminate cracks in bulk group III nitride crystal.

Since cracks may occur due to accumulated stress, it is preferable to grow the crystal in a symmetrical arrangement. To make the crystal symmetrical, a seed crystal of hexagonal shape, triangular shape or rhombus shape having m-plane sidewalls is preferred. The length of the sides are preferably equal with +/−10% error so that the grown crystal becomes symmetrical shape.

This invention is particularly effective when the seed crystal is grown by HVPE, although the seed crystal can be grown by other methods such as an ammonothermal method, MOVPE, and MBE. Currently, it is quite challenging to obtain a crack-free seed crystal having dislocation density less than $10^5$ cm$^{-2}$ using HVPE. This is because group III nitride crystals do not exist naturally. Bulk growth methods such as ammonothermal growth or flux growth require a seed crystal for single-crystal ingot growth, however, the seed crystal is usually obtained by another method such as HVPE. When an HVPE-prepared seed is used, the grown bulk crystal typically cracks when the bulk crystal thickness exceeds 1 mm. By using a seed which only exposes e.g. c-planes and m-planes, cracks originating from the edge of the seed are reduced/eliminated.

Comparative Example—Example 1

Single crystalline GaN seed crystal having a basal plane of c-plane is prepared with HVPE. The thickness of the GaN seed is approximately 430 microns. By cleaving (along m-plane) and breaking (along a-plane), the HVPE GaN seed is made square shape exposing m-plane and a-plane sidewalls. Then, GaN crystal is grown on the seed crystal by ammonothermal method using a high-pressure reactor made of Ni—Cr superalloy.

The inner room of the high-pressure reactor is divided into lower part and the upper part with baffle plates. Approximately 15 g of polycrystalline GaN is used as a nutrient and approximately 3.1 g of sodium is used as a mineralizer. Mineralizer and the seed crystal are placed in the lower part of the high-pressure reactor and the nutrient is placed in the upper part of the high-pressure reactor. Then, the high-pressure reactor is sealed, pumped to a vacuum and filled with anhydrous liquid ammonia. The volumetric ammonia fill factor is approximately 53%.

The high-pressure reactor is heated at about 510–520° C. to allow crystal growth of GaN on the seed. After sufficient amount of time, the ammonia is released and the high-pressure reactor is cooled. The resultant bulk GaN crystal has a thickness of approximately 5 mm. The full-width half maximum (FWHM) of the X-ray 002 peak is less than 150 arcsec, showing a good microstructure. The crystal has yellowish transparent color. The crystal as observed with an optical microscope has small cracks as shown in FIG. 1, 13A and also has a large crack as shown in FIG. 1, 13B. This result demonstrates that cracks in the bulk GaN crystal tend to originate from the interface between the grown crystal and non-m-plane edge of the seed crystal.

Example 2

Two single crystalline GaN seed crystals having a basal plane of c-plane are prepared with HVPE. By cleaving (along m-plane), the HVPE GaN seed is made hexagonal shape exposing only m-plane sidewalls. The thickness of the seed crystals is approximately 430 microns. The length of each side is approximately 1 cm with +/−10% error. Also, the orientation of the sidewall is m-plane with unintentional miscut angle within 5 degrees. The two seed crystals are attached together on Ga-polar c-plane surfaces to make a piece which only exposes N-polar c-planes and m-plane sidewalls. Then, a bulk GaN crystal is grown on the hexagonal seed crystals by ammonothermal method using a high-pressure reactor made of Ni—Cr superalloy.

Similar to the method in Example 1, a hexagonal shape bulk GaN having thickness approximately 5 mm is grown. The yellowish transparent crystal does not have small cracks and does not have large cracks that originate above the interface between the seed sidewalls and the grown crystal. The X-ray FWHM is less than 150 arcsec, representing a good microstructure.

Example 3

Single crystalline GaN seed crystal having a basal plane of c-plane is prepared with HVPE. By dicing along m-plane, the HVPE GaN seed is made hexagonal shape exposing only m-plane sidewalls. The thickness of the seed crystal was approximately 430 microns. Since dicing creates rougher sidewall than cleavage, the seed crystal was immersed in concentrated phosphoric acid maintained at approximately 120° C. for 30 minutes to remove surface or subsurface damage caused by dicing. The length of each side is approximately 1 cm with +/−10% error. Also, the orientation of the sidewall is m-plane with unintentional miscut angle within 5 degrees. Then, a bulk GaN crystal is grown on the hexagonal seed crystal by ammonothermal method using a high-pressure reactor made of Ni—Cr superalloy.

Similar to the method in Example 1, a hexagonal shape bulk GaN having thickness approximately 5 mm is grown. The yellowish transparent crystal shows neither of small cracks and large cracks originating the interface between the seed sidewalls and the grown crystal. The X-ray FWHM is less than 150 arcsec, representing a good microstructure.

Example 4

A hexagonal shaped, single crystalline GaN seed crystal having a basal plane of c-plane is prepared by slicing a bulk crystal of GaN grown by the ammonothermal method. The bulk GaN crystal grown by the ammonothermal method in this example has hexagonal polyhedron shape having m-plane sidewalls, and the crystal is sliced parallel to c-plane to form hexagonal-shaped seeds having only m-plane sidewalls. The thickness of the seed is approximately 500 microns and the length of each side is approximately 1 cm with +/−10% error. Also, the orientation of the sidewall is m-plane with unintentional miscut angle within 5 degrees. Then, GaN crystal is grown on the hexagonal seed crystal by ammonothermal method using a high-pressure reactor made of Ni—Cr superalloy.

Similar to the method in Example 1, a hexagonal shape bulk GaN having thickness approximately 5 mm is grown. The yellowish transparent crystal shows neither small cracks nor large cracks originating above the interface between the seed sidewalls and the grown crystal. The X-ray FWHM is less than 150 arcsec, representing a good microstructure.

Example 5

Similar to Example 4, a hexagonal shaped, single crystalline GaN seed crystal having a basal plane of c-plane is prepared by slicing a bulk crystal of GaN grown by a sodium flux method. The bulk GaN crystal grown by a sodium flux method has hexagonal pyramid shape having {10-11} plane sidewalls. Slicing the crystal parallel to c-plane makes hexagonal-shaped seeds having {10-11} plane sidewalls. Then, the sidewall is cut along m-plane with a crystal dicer followed by etching in hot phosphoric acid as explained in Example 3. The thickness of the seed is approximately 560 microns and the length of each side is approximately 1 cm within +/−10% error. Also, the orientation of the sidewall is m-plane with unintentional miscut angle within 5 degrees. Then, the hexagonal seed crystal is used to grow an ingot of single-crystal GaN by ammonothermal method using a high-pressure reactor made of Ni—Cr superalloy.

Similar to the method in Example 1, a hexagonal shape bulk GaN having thickness approximately 5 mm is grown. The yellowish transparent crystal shows neither small cracks nor large cracks originating above the interface between the seed sidewalls and the grown crystal. The X-ray FWHM is less than 150 arcsec, representing a good microstructure.

Example 6

Wafers are formed from bulk group III nitride of the examples above. An electronic device is formed on wafers of each of the examples above using conventional circuit fabrication techniques known to those in the field of making electronic devices using group III nitride (e.g. by ion implantation, etching, and placing additional layers of materials on the wafers). Likewise, optical and optoelectronic devices are formed on wafers using conventional fabrication techniques.

Advantages and Improvements

The bulk GaN crystal of this invention contains no small or large cracks originating the interface between the sidewall of a seed crystal and the grown crystal. The obtained crack-free bulk GaN crystals are sliced into wafers. These wafers are used for optical devices such as LEDs and laser diodes or electronic devices such as high-power transistors. Since cracks deteriorate performances and reliability of these devices significantly, this invention can improve the device performance and reliability.

Possible Modifications

Although the preferred embodiment describes bulk crystals of GaN, similar benefit of this invention can be expected for other group III nitride alloys of various composition, such as AlN, AlGaN, InN, InGaN, or GaAlInN.

Although the preferred embodiment describes GaN seed crystal having thickness about 430 microns, 500 microns, 560 microns, similar benefit of this invention can be expected for other thicknesses between 100 microns to 2000 microns.

Although the preferred embodiment describes ammonothermal growth, similar benefit of this invention can be expected for other bulk growth methods such as a flux method or high-pressure, high-temperature solution growth. In the flux method, a group III metal and a flux such as sodium are melted together, and nitrogen then dissolves into the melt. One flux method is disclosed in U.S. Pat. No. 5,868,837. One suitable high-pressure, high-temperature solution growth method is disclosed in U.S. Pat. No. 6,273,948. Each of these patents is incorporated by reference herein.

Although the preferred embodiment describes a seed crystal having a width from one sidewall to a parallel sidewall of approximately 1 cm, similar benefit of this invention is expected for a larger seed such as 1", 2", 4", 6" and larger.

A bulk crystal as described, as made, or as used in any of the description above may have a thickness greater than or equal to: 1 mm, 2 mm, 3 mm, 4 mm, 5 mm, 6 mm, 7 mm, 8 mm, 9 mm, 10 mm, for instance.

In view of the foregoing, following are various examples of what is disclosed that are not limiting of the scope of the invention described here:

1. A method of growing a bulk crystal of group III nitride having a composition of $Ga_{x1}Al_{y1}In_{1-x1-y1}N$ ($0 \leq x1 \leq 1$, $0 \leq x1+y1 \leq 1$) comprising,
   (a) preparing at least one seed crystal of $Ga_{x2}Al_{y2}In_{1-x2-y2}N$ ($0 \leq x2 \leq 1$, $0 \leq x2+y2 \leq 1$) having basal planes of c-orientation with miscut angle less than 5 degrees and all exposed sidewalls of m-orientation with miscut angle less than 5 degrees;
   (b) growing the bulk crystal of group III nitride on at least one basal plane of the seed crystal without creating cracks above the edges of the seed crystal.

2. A method according to paragraph 1 wherein the seed crystal has a hexagonal shape.

3. A method according to paragraph 1 or paragraph 2 wherein the bulk crystal has a thickness greater than 1 mm.

4. A method according to paragraph 3 wherein said thickness is greater than a thickness of a comparative bulk crystal grown under identical conditions but grown on a square seed crystal.

5. A method according to any of paragraphs 1 through 4 wherein all of the sidewalls of the seed crystal have a length within +/−10% of one another.

6. A method according to any of paragraphs 1 through 5 wherein the seed crystal is obtained by a vapor phase method and at least one of the sidewalls is obtained by cleavage along m-planes.

7. A method according to any of paragraphs 1 through 5 wherein the seed crystal is obtained by a vapor phase method and at least one of the sidewalls is obtained by mechanical dicing along m-planes and removal of mechanical damage.

8. A method according to paragraph 7 wherein the removal of mechanical damage is carried out by chemical etching in liquid containing phosphoric acid.

9. A method according to any paragraph above wherein the bulk crystal is grown in supercritical ammonia.

10. A method according to paragraph 9 wherein the seed crystal has a hexagonal shape.

11. A method according to paragraph 9 or paragraph 10 wherein the seed crystal is obtained from a bulk crystal of group III nitride grown in supercritical ammonia or a melt of group III metal and at least one of the sidewalls is a natural facet formed during the growth in supercritical ammonia or a melt of group III metal.

12. A method according to any of paragraphs 9 through 11 wherein the bulk crystal is grown on nitrogen polar surfaces of first and second seed crystals having c-plane orientation with miscut angle less than 5 degrees, each seed crystal having sides that have a length within +/−10% of one another, and wherein a Ga-polar face of the first seed crystal is attached to a Ga-polar face of the second seed crystal.

13. A method according to any paragraph above wherein the bulk crystal is GaN.

14. A method of growing a bulk crystal of group III nitride having a composition of $Ga_{x1}Al_{y1}In_{1-x1-y1}N$ ($0 \leq x1 \leq 1$, $0 \leq x1+y1 \leq 1$) comprising forming $Ga_{x1}Al_{y1}In_{1-x1-y1}N$ ($0 \leq x1 \leq 1$, $0 \leq x1+y1 \leq 1$) on a basal face of a seed crystal of $Ga_{x2}Al_{y2}In_{1-x2-y2}N$ ($0 \leq x2 \leq 1$, $0 \leq x2+y2 \leq 1$) and in a direction along an axis perpendicular to a basal plane of the basal face, wherein the seed crystal has only slow-growing edges exposed for growth in a lateral direction that is perpendicular to said axis.

15. A method according to paragraph 14 wherein the slow-growing edges are prismatic faces of the seed crystal.

16. A method according to paragraph 15 wherein the seed crystal has six prismatic faces.

17. A method of growing a bulk crystal of group III nitride having a composition of $Ga_{x1}Al_{y1}In_{1-x1-y1}N$ ($0 \leq x1 \leq 1$, $0 \leq x1+y1 \leq 1$) comprising forming $Ga_{x1}Al_{y1}In_{1-x1-y1}N$ ($0 \leq x1 \leq 1$, $0 \leq x1+y1 \leq 1$) on a basal face of a seed crystal of $Ga_{x2}Al_{y2}In_{1-x2-y2}N$ ($0 \leq x2 \leq 1$, $0 \leq x2+y2 \leq 1$) and in a direction along an axis perpendicular to a basal plane of the basal face, wherein the seed crystal has a first and second basal face, wherein the seed crystal has a plurality of edge faces extending between the first basal face and the second basal face, said plurality of edge faces extending completely around a perimeter of the first basal face and the second basal face, and wherein each of the plurality of edge faces are oriented with a second plane, said second plane being different from the basal plane.

18. A method according to paragraph 17 wherein the second plane is m-plane.

19. A method according to paragraph 17 or paragraph 18 wherein the basal plane is c-plane.

20. A method of growing a bulk crystal of group III nitride having a composition of $Ga_{x1}Al_{y1}In_{1-x1-y1}N$ ($0 \leq x1 \leq 1$, $0 \leq x1+y1 \leq 1$) comprising forming $Ga_{x1}Al_{y1}In_{1-x1-y1}N$ ($0 \leq x1 \leq 1$, $0 \leq x1+y1 \leq 1$) comprising forming $Ga_{x2}Al_{y2}In_{1-x2-y2}N$ ($0 \leq x2 \leq 1$, $0 \leq x2+y2 \leq 1$) and in a direction along an axis perpendicular to a basal plane of the basal face, wherein the seed crystal has only slow-growing edges exposed for growth in a lateral direction that is perpendicular to said axis.

21. A method according to paragraph 20 wherein the slow-growing edges are prismatic faces of the seed crystal.

22. A method according to paragraph 21 wherein the seed crystal has six prismatic faces.

23. A method according to any paragraph above wherein x2=1.

24. A bulk crystal of group III nitride made by a method of any paragraph above.

25. A bulk crystal of group III nitride having a composition of $Ga_{x1}Al_{y1}In_{1-x1-y1}N$ ($0 \leq x1 \leq 1$, $0 \leq x1+y1 \leq 1$) and a thickness larger than 1 millimeter wherein the bulk crystal is grown on at least one basal plane of a seed crystal having a composition of $Ga_{x2}Al_{y2}In_{1-x2-y2}N$ ($0 \leq x2 \leq 1$, $0 \leq x2+y2 \leq 1$) and the bulk crystal has no cracking above the edges of the seed crystal.

26. A bulk crystal of group III nitride having a composition of $Ga_{x1}Al_{y1}In_{1-x1-y1}N$ ($0 \leq x1 \leq 1$, $0 \leq x1+y1 \leq 1$) and containing a seed crystal having a composition of $Ga_{x2}Al_{y2}In_{1-x2-y2}N$ ($0 \leq x2 \leq 1$, $0 \leq x2+y2 \leq 1$), wherein the bulk crystal has a thickness greater than 1 mm and the bulk crystal has fewer cracks within the bulk crystal above the seed crystal's edge than a comparative bulk crystal grown under otherwise identical conditions but grown using a square seed having the same surface area as said seed crystal but having m-plane and a-plane walls.

27. A bulk crystal of group III nitride according to paragraph 25 or paragraph 26, wherein the seed crystal has the following characteristics:
   (a) the basal plane of the seed is c-plane oriented with miscut angle less than 5 degrees;
   (b) all exposed sidewalls are m-planes with miscut angle less than 5 degrees.

28. A bulk crystal of group III nitride of paragraph 27 wherein the seed crystal has a hexagonal shape.

29. A bulk crystal of group III nitride of paragraph 28 wherein all of the exposed sides of the seed crystal have a length with +/−10% error of each other.

30. A bulk crystal of group III nitride of paragraph 25 through 29 wherein the bulk crystal is grown in supercritical ammonia.

31. A bulk crystal of group III nitride of paragraph 30 wherein the bulk crystal contains two seed crystals of c-plane orientation having practically identical shape and size with +/−10% error in length, with both Ga-polar face attached on each other so that only N-polar c-planes and m-planes are exposed for growth.

32. A bulk crystal of $Ga_{x1}Al_{y1}In_{1-x1-y1}N$ ($0 \leq x1 \leq 1$, $0 \leq x1+y1 \leq 1$) comprising
   (a) a seed crystal composed of $Ga_{x2}Al_{y2}In_{1-x2-y2}N$ ($0 \leq x2 \leq 1$, $0 \leq x2+y2 \leq 1$), the seed crystal having a first basal face, a second basal face opposite the first basal face, and a plurality of edge faces extending between the first basal face and the second basal face, said plurality of edge faces extending completely around a perimeter of the first basal face and the second basal face;
   (b) a first layer of $Ga_{x1}Al_{y1}In_{1-x1-y1}N$ ($0 \leq x1 \leq 1$, $0 \leq x1+y1 \leq 1$) on the first basal face of said seed crystal
   (c) a second layer of $Ga_{x1}Al_{y1}In_{1-x1-y1}N$ ($0 \leq x1 \leq 1$, $0 \leq x1+y1 \leq 1$) on said edge faces of the seed crystal, said second layer having a minimum thickness and a maximum thickness
   (d) and wherein the first layer has a thickness of at least five times the maximum thickness of said second layer.

33. A bulk crystal of single-crystal $Ga_{x1}Al_{y1}In_{1-x1-y1}N$ ($0 \leq x1 \leq 1$, $0 \leq x1+y1 \leq 1$) having a seed crystal as a portion of the bulk crystal, wherein the bulk crystal has a thickness greater than 1 mm, and the bulk crystal has no cracks within the bulk crystal above an edge of the seed crystal.

34. A bulk crystal of group III nitride of paragraph 25 through 33 wherein the bulk crystal is GaN.

35. A wafer of group III nitride fabricated from the bulk crystal of group III nitride of any of paragraphs 24-34.

36. An electronic, optical, or optoelectronic device formed using a wafer of paragraph 35.

37. A method comprising processing a single-crystal ingot of $Ga_{x2}Al_{y2}In_{1-x2-y2}N$ ($0 \leq x2 \leq 1$, $0 \leq x2+y2 \leq 1$) produced by heteroepitaxial deposition of the $Ga_{x2}Al_{y2}In_{1-x2-y2}N$ ($0 \leq x2 \leq 1$, $0 \leq x2+y2 \leq 1$) on a substrate to form a seed crystal that has a first basal face, a second basal face, and a plurality of edge faces extending between the first basal face and the second basal face, said plurality of edge faces extending completely around a perimeter of the first basal face and the second basal face, wherein said edge faces individually have a growth rate less than 20 microns per day and said first basal face has a growth rate greater than 20 microns per day.

38. A method according to paragraph 37 wherein the seed crystal is formed using HVPE.

39. A method according to paragraph 37 wherein the seed crystal is formed using MOVPE.

40. A method according to paragraph 37 wherein the seed crystal is formed using MBE.

41. A method according to any of paragraphs 37-40 wherein x2=1.

42. A seed crystal of $Ga_{x2}Al_{y2}In_{1-x2-y2}N$ ($0 \leq x2 \leq 1$, $0 \leq x2+y2 \leq 1$) as described in any paragraph above.

What is claimed is:

1. A method of growing a bulk crystal of group III nitride having a composition of $Ga_{x1}Al_{y1}In_{1-x1-y1}N$ ($0 \leq x1 \leq 1$, $0 \leq x1+y1 \leq 1$) comprising,
    (a) preparing using heteroepitaxial deposition at least one seed crystal of $Ga_{x2}Al_{y2}In_{1-x2-y2}N$ ($0 \leq x2 \leq 1$, $0 \leq x2+y2 \leq 1$) having basal planes of c-orientation with miscut angle less than 5 degrees and all exposed sidewalls of m-orientation with miscut angle less than 5 degrees, wherein the seed crystal is formed by a vapor phase method and at least one of the sidewalls is obtained by cleavage along m-plane or mechanical dicing along m-plane and removal of mechanical damage;
    (b) growing the bulk crystal of group III nitride on at least one basal plane of the seed crystal in supercritical ammonia without creating cracks above the sidewalls of the seed crystal, wherein the bulk crystal has a thickness greater than 1 mm.

2. A method according to claim 1 wherein the seed crystal has a hexagonal shape.

3. A method according to claim 2 wherein all of the sidewalls of the seed crystal have a length within +/−10% of one another.

4. A method according to claim 3, wherein x2=1.

5. A method according to claim 1 wherein each of the sidewalls is obtained by cleavage along m-planes.

6. A method according to claim 5, wherein x2=1.

7. A method according to claim 1 wherein the removal of mechanical damage is carried out by chemical etching in liquid containing phosphoric acid.

8. A method according to claim 1 wherein the bulk crystal is grown on nitrogen polar surfaces of two seed crystals having c-plane orientation with miscut angle less than 5 degree, having same shape and size with +/−10% error in length, with both Ga-polar faces of the two seed crystals attached to each other.

9. A method according to claim 8, wherein x2=1.

10. A method according to claim 1 wherein the bulk crystal is GaN.

11. A method according to claim 10, wherein x2=1.

* * * * *